US009209827B2

(12) United States Patent  (10) Patent No.: US 9,209,827 B2
Lam et al.  (45) Date of Patent: Dec. 8, 2015

(54) DIGITAL TUNING ENGINE FOR HIGHLY PROGRAMMABLE DELTA-SIGMA ANALOG-TO-DIGITAL CONVERTERS

(71) Applicant: ANALOG DEVICES GLOBAL, Hamilton (BM)

(72) Inventors: Kevin Cao-Van Lam, Mississauga (CA); Richard E. Schreier, Toronto (CA); Donald W. Paterson, Winchester, MA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/657,919

(22) Filed: Mar. 13, 2015

(65) Prior Publication Data
US 2015/0188562 A1  Jul. 2, 2015

Related U.S. Application Data

(63) Continuation of application No. 13/945,647, filed on Jul. 18, 2013, now Pat. No. 9,030,342.

(51) Int. Cl.
*H03M 1/10* (2006.01)
*H03M 3/00* (2006.01)

(52) U.S. Cl.
CPC .............. *H03M 3/38* (2013.01); *H03M 1/1009* (2013.01); *H03M 3/392* (2013.01); *H03M 3/424* (2013.01); *H03M 3/454* (2013.01)

(58) Field of Classification Search
CPC ..... H03M 1/167; H03M 1/1057; H03M 1/10; H03M 3/38; H03M 3/424; H03M 3/392; H03M 3/454; H03M 3/456; H03M 3/43; H03M 3/382; H04B 1/10; H04B 1/16
USPC .......... 341/120–155; 375/130, 144, 149, 347, 375/350, 267, 219; 455/118, 323; 370/286, 370/288
See application file for complete search history.

(56) References Cited

U.S. PATENT DOCUMENTS 5,387,913 A * 2/1995 Park et al. ..................... 341/155
5,952,947 A   9/1999 Nussbaum et al.
(Continued)

FOREIGN PATENT DOCUMENTS

EP  2827502  1/2015

OTHER PUBLICATIONS

Notice of Allowance for U.S. Appl. No. 13/945,657 mailed Jan. 12, 2015, 10 pages.
(Continued)

*Primary Examiner* — Lam T Mai
(74) *Attorney, Agent, or Firm* — Patent Capital Group

(57) ABSTRACT

An integrated circuit includes a component calculator configured to compute at least one component value of a highly programmable analog-to-digital converter (ADC) from at least one application parameter, and a mapping module configured to map the component value to a corresponding register setting of the ADC based on at least one process parameter, wherein the integrated circuit produces digital control signals capable of programming the ADC. In a specific embodiment, the component calculator uses an algebraic function of a normalized representation of the application parameter to approximately evaluate at least one normalized ADC coefficient. The component value is further calculated by decimalizing the normalized ADC coefficient. In another specific embodiment, the component calculator uses an algebraic function of the application parameter to calculate the component value. In some embodiments, the integrated circuit further includes a scaling module configured to scale the component value based on scaling parameters.

35 Claims, 7 Drawing Sheets

(56) References Cited

U.S. PATENT DOCUMENTS

| | | | |
|---|---|---|---|
| 6,486,807 | B2 | 11/2002 | Jonsson |
| 6,577,258 | B2 | 6/2003 | Ruha et al. |
| 6,680,682 | B2 | 1/2004 | Arnaud et al. |
| 6,693,572 | B1 * | 2/2004 | Oliaei et al. .................. 341/120 |
| 7,221,302 | B1 | 5/2007 | Melanson |
| 8,462,030 | B2 | 6/2013 | Muhammad |
| 8,638,836 | B2 * | 1/2014 | Midya et al. .................. 375/219 |
| 9,030,342 | B2 * | 5/2015 | Lam et al. ..................... 341/120 |
| 2002/0145551 | A1 | 10/2002 | Arnaud et al. |
| 2005/0237233 | A1 | 10/2005 | Muhammad |
| 2013/0266102 | A1 * | 10/2013 | Yan et al. ...................... 375/350 |
| 2014/0200850 | A1 | 7/2014 | Muldowney et al. |
| 2015/0022386 | A1 * | 1/2015 | Lam et al. ..................... 341/120 |

OTHER PUBLICATIONS

European Extended Search Report for EP Patent Application Serial No. EP14173539.9 mailed Feb. 17, 2015, 8 pages.

"Programming the TMS320VC5509 ADC Peripheral," Application Report, SPRA786—Jan. 2010, Texas Instruments, http://www-s.ti.com/sc/techlit/spra786.zip, 9 pages.

Baker, Bonnie, "How Delta-Sigma ADCs Work, Part 1," Texas Instruments, Inc., Data Acquisitions, Analog Applications Journal, 3Q 2011, High-Performance Analog Products, www.ti.com/aaj, 6 pages.

Baker, Bonnie, "How Delta-Sigma ADCs Work, Part 2," Texas Instruments, Inc., Data Acquisitions, Analog Applications Journal, 4Q 2011, High-Performance Analog Products, www.ti.com/aaj, 5 pages.

Yamamoto, Kentaro et al., "A Delta-Sigma Modulator with a Widely Programmable Center Frequency and 82-dB Peak SNDR," IEEE 2007 Custom Intergrated Circuits Conference (CICC), 14244-1623-X/07, 2007, pp. 65-68.

Canberra, "Model 9635 ICB Programmable ADC," 2007 Canberra Industries, Inc., 3 pages.

MAX 11206/MAX11207, 20-Bit, Single-Channel, Ultra-Low-Power, Delta-Sigma ADCs with Programmable Gain and GPIO, Maxim Integrated, 19-5294; Rev. 1; Oct. 2012, 27 pages.

16-Bit, Programmable Delta-Sigma ADC with 6-Bit Latch, Crystal, a Divisional of Cirrus Logic, CS5529, Cirrus Logic, 1997, PI246PP1, Oct. 1997, 15 pages.

Response to EP Extended Search Report in EP Patent Application Serial No. 14173539.9 filed Aug. 10, 2015, 12 pages.

* cited by examiner

DIGITAL TUNING ENGINE FOR HIGHLY PROGRAMMABLE DELTA-SIGMA ANALOG-TO-DIGITAL CONVERTERS

CROSS-REFERENCE TO RELATED APPLICATION

This Application is a continuation (and claims the benefit of priority under 35 U.S.C. §120) of U.S. application Ser. No. 13/945,647, filed Jul. 18, 2013, and entitled "Digital Tuning Engine For Highly Programmable Delta-Sigma Analog-to-Digital Converters", naming Kevin Cao-Van Lam et al., as inventors. The disclosure of the prior Application is considered part of and is incorporated by reference in the disclosure of this Application.

FIELD OF THE DISCLOSURE

This disclosure relates in general to the field of electronic devices and, more particularly, to a digital tuning engine for highly programmable sigma-delta analog-to-digital converters (ADCs).

BACKGROUND

The delta-sigma ($\Delta$-$\Sigma$) ADC (or, equivalently, sigma-delta ($\Sigma$-$\Delta$) ADC) is typically used in modern voice-band, audio, and high-resolution precision industrial measurement applications. As used herein, the term "ADC" includes any device, electrical/electronic circuit, or integrated circuit that can convert a continuous physical electrical quantity (e.g., voltage, current) to a digital number that can represent the quantity's amplitude (or other property). The $\Delta$-$\Sigma$ ADC is generally used to convert analog signals over a relatively narrow range of frequencies, typically less than 5% of the ADC's sample rate. With current technology, it is possible to support a sample rate of several GHz and thus $\Delta$-$\Sigma$ ADCs typically support bandwidths less than 200 MHz. With bandpass $\Delta$-$\Sigma$ ADCs, this bandwidth may be located at frequencies that are substantial fractions of the sample rate, namely from direct current (DC) to several hundred megahertz. A typical $\Delta$-$\Sigma$ ADC comprises an over sampling modulator followed by a digital decimation filter that together produce a high-resolution data stream output. A user-programmable $\Delta$-$\Sigma$ ADC is typically used to configure the ADC for a particular application. For example, an ADC used in a receiver for multi-carrier GSM (global system for mobile communications) might require a bandwidth of 40 MHz at an intermediate frequency (IF) of 180 MHz, whereas an ADC used in a long term evolution (LTE) receiver might require a bandwidth of 75 MHz at an IF of 300 MHz.

SUMMARY OF THE DISCLOSURE

An integrated circuit includes a component calculator configured to compute at least one component value of a highly programmable analog-to-digital converter (ADC) from at least one application parameter, and a mapping module configured to map the component value to a corresponding register setting of the ADC based on at least one process parameter, wherein the integrated circuit produces digital control signals capable of programming the ADC. As used herein, the term "highly programmable ADC" comprises an ADC configured to have substantially continuously programmable bandwidth and center frequency over a substantial range (e.g., factor of two). As used herein, the term "register setting" comprises values of bits in one or more control registers of the ADC. In some embodiments, the integrated circuit further includes a scaling module configured to scale the component value based on scaling parameters. The scaling parameters can include a first set of parameters for state scaling and a second set of parameters for admittance scaling.

In a specific embodiment, the component calculator uses an algebraic function of a normalized representation (e.g., scaled relative to a parameter, such as sampling frequency) of the application parameter to approximately evaluate at least one normalized ADC coefficient. Algebraic functions include algebraic expressions built from constants, variables, and a finite set of algebraic operations (e.g., addition, subtraction, multiplication, division, exponentials, etc.). The component value is further calculated by decimalizing the normalized ADC coefficient. In a specific embodiment, the algebraic function comprises a polynomial function. In some embodiments, the application parameter comprises a center frequency of the ADC, and the normalized representation of the application parameter comprises a ratio of the center frequency and a sampling frequency. In another specific embodiment, the component calculator uses an algebraic function of the application parameter to calculate the component value.

In some embodiments, the component calculator, the scaling module, and the mapping module are realized on a microprocessor. In some embodiments, the integrated circuit can include the ADC.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

Figure 1:
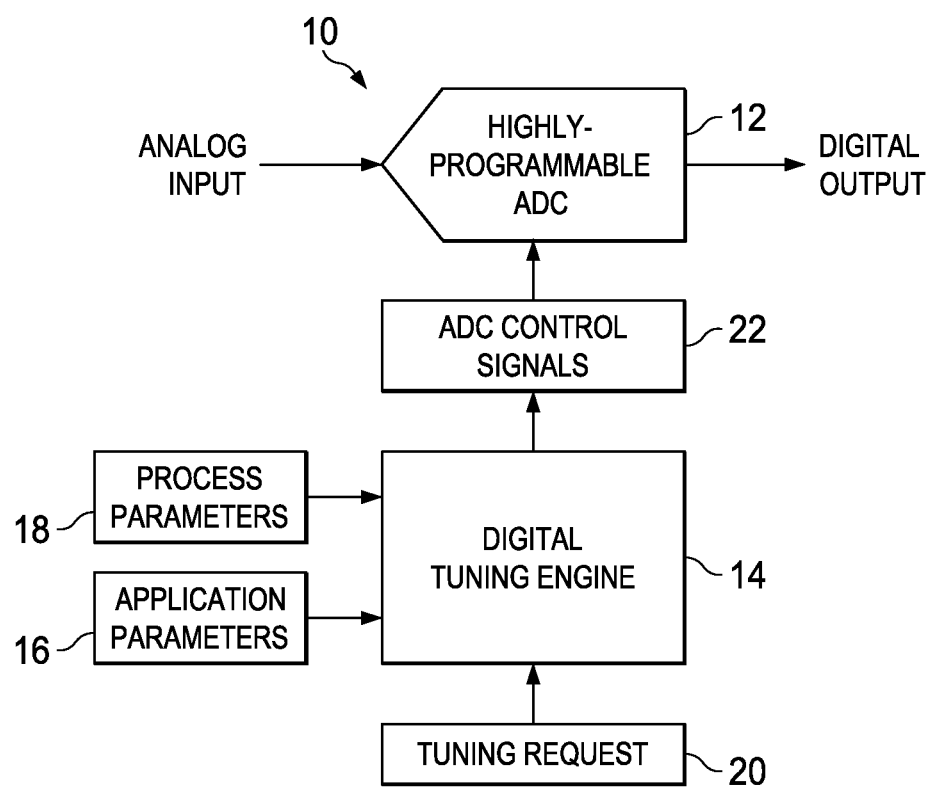
FIG. 1 is a simplified block diagram of a system including a digital tuning engine for highly programmable $\Delta$-$\Sigma$ ADCs in accordance with one embodiment.

The present disclosure provides for a digital tuning engine for highly programmable $\Delta$-$\Sigma$ ADCs in accordance with some embodiments. In general, programmable ADCs include control registers for configuring the ADC. These registers are typically non-memory mapped and are accessible only via read and write commands. Typical, programmable ADCs that are capable of a high degree of tunability, for example, to support several modes of operation, have appropriate register settings pre-computed, hard-coded and unchangeable during operation (e.g., in real time, during use, or between uses). For example, AD9368 from Analog Devices, Inc. Includes a programmable ADC with hard-coded register settings that allow supporting a few finite modes of operation. To support multiple modes of operation, the register settings are generated using external software and then passed to the ADC system prior to operations.

A typical programmable $\Delta$-$\Sigma$ ADC includes an attenuator or low noise amplifier (LANA), both of adjustable gain, that can accept an analog signal. The output of the LANA/attenuator can be coupled to a loop filter comprising three resonators. The output of the loop filter may be coupled to a quantized (e.g., flash ADC), and the output of the quantized is fed back to the loop filter using a plurality of digital-to-analog converters (DACs). The loop filter's resistor and capacitor values, the feedback DACs' currents, the flash's full-scale, the LAN/attenuator's settings, the amplifiers' bias currents and the relative timing of the flash and DACS are typically digitally programmable. With programmable amplifier bias currents, 8-bit resolution on the DAC currents, resistor values, flash full-scale and up to 12-bit resolution on capacitors, there can be more than 500 control bits (e.g., associated with the register settings) to be pre-computed for configuring the ADC appropriately for a particular application.

However, it may be desirable to generate the ADC register settings dynamically (e.g., during operation of the ADC, prior to using the ADC for a specific application, using the ADC for different applications with register settings changed in-between the applications, etc.). Generating the register settings dynamically can allow greater flexibility and modularity to use the ADC for a variety of applications, with little hassle from the user's point of view. In addition, the programmable nature of the ADC can provide the opportunity to compensate for non-ideal effects or variation in component values from board to board. As used herein, the term "component value" refers to the value of a relevant property of an electronic component, such as capacitance of a capacitor; resistance or conductance of a resistor; inductance of an inductor; least significant bit (LSB) size of an ADC or DAC; etc.

Moreover, a highly-programmable $\Delta$-$\Sigma$ ADC has a large number of register settings that can be complex functions of application parameters, such as clock frequency, center frequency, bandwidth, full-scale, etc., and process parameters such as sheet resistance and capacitance per unit area. Compounding this complexity are design parameters such as signal swing, stage impedance and NTF gain that can affect the performance of the $\Delta$-$\Sigma$ ADC. For example, a 6th order $\Delta$-$\Sigma$ ADC can have 20 register settings with 8 or more bits of resolution, requiring elaborate software running on a desktop computer to compute the ADC register settings. To make such a $\Delta$-$\Sigma$ ADC more readily usable, a system, which can quickly translate user parameters into the ADC's digital control signals, is desired.

Turning to FIG. 1, FIG. 1 is a simplified block diagram of a system 10 comprising a digital tuning engine according to an example embodiment. System 10 includes a highly programmable $\Delta$-$\Sigma$ ADC 12 that can accept an analog input and produce a digital output. In various embodiments, highly programmable $\Delta$-$\Sigma$ ADC 12 can include at least one analog loop filter with programmable components, a quantized whose input is coupled to an output of the analog loop filter, and one or more feedback DACs whose input is coupled to an output of the quantized and whose output is coupled to the analog loop filter. Highly programmable $\Delta$-$\Sigma$ ADC 12 can also include at least four digital inputs that control various parameters of $\Delta$-$\Sigma$ ADC 12, such as resistor and capacitor values within the loop filter, a least significant bit (LSB) size of the feedback DACs, a LSB size of the quantized, or power consumption of amplifiers. In various embodiments, the digital inputs may have fine enough resolution to support a wide variety of clock frequencies, signal bandwidths, center frequencies, and/or power usages. Highly programmable $\Delta$-$\Sigma$ ADC 12 can have digital controls for a substantial fraction of its components. The range of the controls may be sufficient to tune $\Delta$-$\Sigma$ ADC 12 over at least an octave of frequency in sample rate or center frequency. In addition, the resolution of the controls may be sufficient to provide essentially continuous coverage of the octave in sample rate or center frequency.

A digital tuning engine 14 may be electrically connected to $\Delta$-$\Sigma$ ADC 12, and can accept application parameters 16 and process parameters 18. As used herein, the term "application parameters" includes parameters (e.g., measurable factors, vectors, quantities, characteristics, aspects, features, etc.) that substantially influence the performance of the $\Delta$-$\Sigma$ ADC (e.g., $\Delta$-$\Sigma$ ADC 12) in a specific application (e.g., use to which the $\Delta$-$\Sigma$ ADC is put, such as instrumentation/measurement, voice-band, audio, etc.); examples of application parameters include, without limitation, clock frequency, center frequency, bandwidth, power consumption, and/or the value of external components (e.g., resistors, capacitors, inductors, etc.). In some embodiments, application parameters 16 may be determined from specifications of the relevant application, electronic device, or electronic system in which $\Delta$-$\Sigma$ ADC 12 is to be used. In some embodiments, application parameters 16 can include scaling parameters for state-scaling and admittance scaling.

The term "process parameters" includes parameters that indicate deviations from nominal values for components associated with the $\Delta$-$\Sigma$ ADC (e.g., $\Delta$-$\Sigma$ ADC 12); process parameters can include calibrated values of certain properties of the $\Delta$-$\Sigma$ ADC; examples of process parameters include, without limitation, capacitance per unit area, sheet resistance, parasitic resistance and comparator offset. In particular, process parameters can include a collection of information that, for capacitors, can define a zero-code capacitance (e.g., capacitance for a zero register setting in the $\Delta$-$\Sigma$ ADC; base capacitance) and capacitance per code (e.g., register setting of the $\Delta$-$\Sigma$ ADC), and similar information for programmable conductances. In some embodiments, process parameters 18 may be determined by testing $\Delta$-$\Sigma$ ADC 12 under appropriate test conditions (e.g., during manufacturing), simulated application conditions, or by calibrating $\Delta$-$\Sigma$ ADC 12 appropriately. In some embodiments, process parameters 18 may be determined in an on-demand fashion using dedicated calibration circuits on an integrated circuit implementing $\Delta$-$\Sigma$ ADC 12.

In some embodiments, application parameters 16 and process parameters 18 may be stored in a suitable memory element accessible by digital tuning engine 14. In other embodiments, application parameters 16 and process parameters 18 may be provided to digital tuning engine 14 directly by a user, for example, through appropriate software, commands, instructions, electronic signals, etc. In yet other embodiments, application parameters 16 and process parameters 18 may be provided to digital tuning engine 14 by appropriate software, external device, etc., for example, upon trigger of certain predetermined conditions.

According to various embodiments, in response to a tuning request 20 (e.g., a "go" message from a user; an electronic signal that can turn on digital tuning engine 14; a specific message from a user, external device, application software, etc., instructing digital tuning engine 14 to perform its operations), digital tuning engine 14 can convert application parameters 16 and process parameters 18 to ADC control signals 22, which may be applied to Δ-Σ ADC 12. In a specific embodiment, ADC control signals 22 may comprise digital signals. ADC control signals 22 can configure Δ-Σ ADC 12 to operate according to a specific set of application parameters 16 (e.g., specific clock frequency, center frequency, bandwidth, power usage, etc.). In some embodiments, ADC control signals 22 may remain static upon completion of the tuning operation (e.g., after generation of ADC control signals 22) until a new tuning request 20 is made.

According to various embodiments, application parameters 16 can be converted to unscaled component values using direct formulae or a combination of normalized formulae and denormalization. In some embodiments, unscaled component values may be scaled for swing and/or impedance level, as appropriate. The component values may be mapped to control register settings in accordance with process parameters 18.

In some embodiments, digital tuning engine 14 and Δ-Σ ADC 12 may be realized (e.g., implemented) on a single integrated circuit. In other embodiments, digital tuning engine 14 and Δ-Σ ADC 12 may be realized in separate integrated circuits. For example, digital tuning engine 14 may be implemented on a microprocessor electrically connected to Δ-Σ ADC 12.

Figure 2:
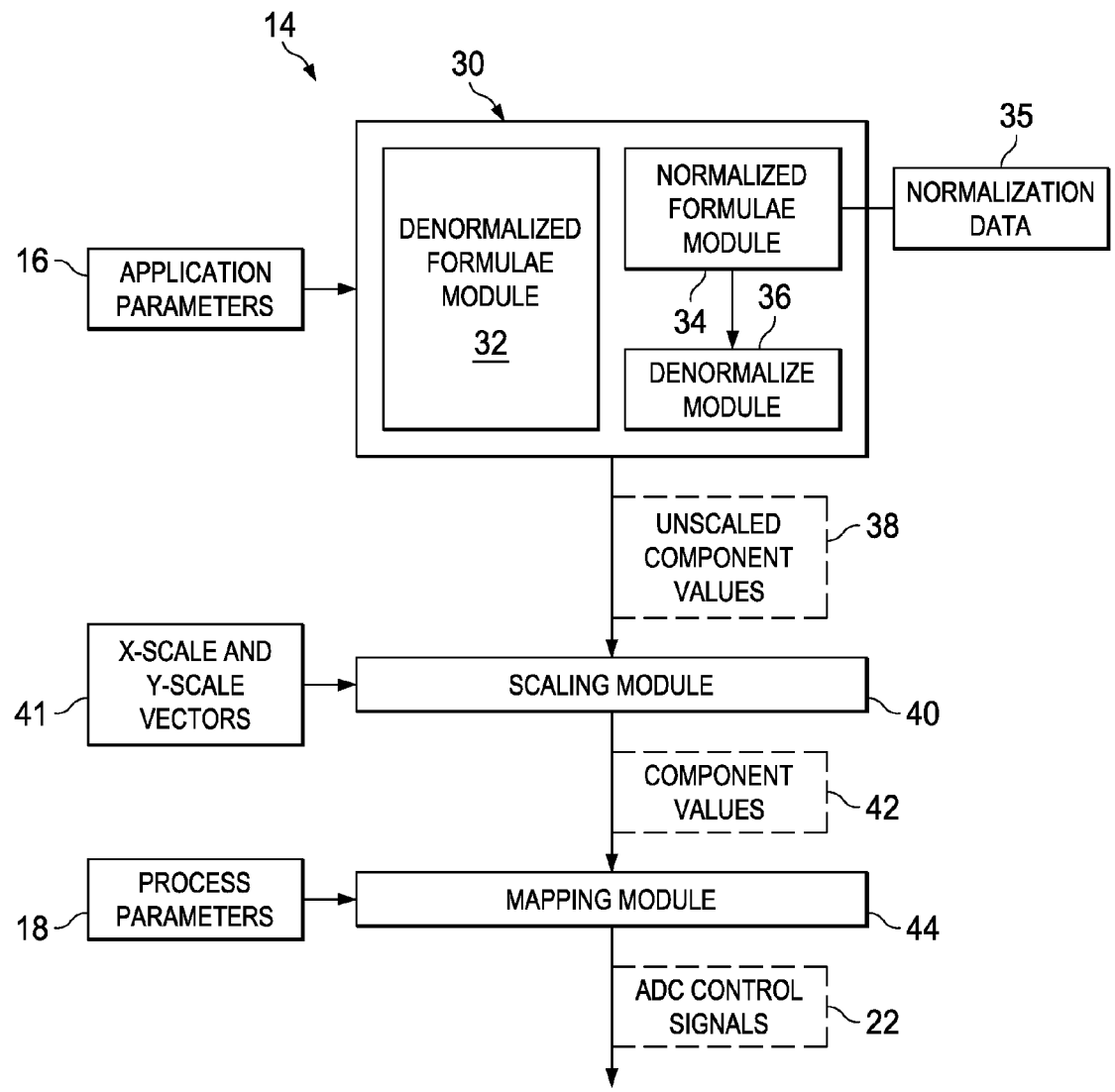
FIG. 2 is a simplified block diagram of example details of the system according to one or more embodiments.

Turning to FIG. 2, FIG. 2 is a simplified block diagram illustrating example details of an embodiment of digital tuning engine 14. Digital tuning engine 14 may comprise a component calculator 30 that includes a denormalized formulae module 32, a normalized formulae module 34 that receives normalization data 35, and a denormalize module 36. In some embodiments, normalization data 35 may be stored in a separate database realized on a non-volatile memory (NVM). The NVM may also store software that, when executed (e.g., on a suitable microprocessor), performs operations of digital tuning engine 14. In some embodiments, the NVM may also store a tuning table comprising process parameters 18.

Component calculator 30 may be configured to receive application parameters 16 and compute component values (e.g., values of capacitance, inductance, conductance, current, etc. associated with capacitors, inductors, resistors, feedback DACs, etc.). In some embodiments, the computed component values may be in a form of unscaled component values 38. Normalized formula module may use an algebraic function of a normalized representation of the application parameter to approximately evaluate normalized ADC coefficients. Unscaled component values 38 may be calculated by decimalizing the normalized ADC coefficients. Denormalized formulae module 32 may use algebraic functions of application parameters to calculate the component values directly (e.g., without normalizing).

In general terms, unscaled component values 38 may be computed via algebraic functions of application parameters 16. Using well-known procedures, scaled delta sigma modulator realizations for a given ADC architecture may be calculated apriori (e.g., using suitable algorithms offline) and stored (e.g., hardcoded, saved in memory, etc.) in the NVM, and retrieved as normalization data 35. The use of normalization can allow for reduction in dimensions of the storage element that stores normalization data 35. In one example, by dividing by frequencies (e.g., sampling frequency $F_s$), normalization can be achieved to yield scaled delta sigma modulator realizations (that can be stored as normalization data 35) in terms of normalized center frequency $f_0 = F_0/F_s$ and normalized bandwidth $bw = BW/F_s$, where $F_0$, $F_s$ and BW are the center frequency, sampling frequency, and bandwidth, respectively according to application parameters 16. Curve-fitting can yield approximate expressions for each of the components or coefficients in Δ-Σ ADC 12. For example, a suitable polynomial may be used to approximate the normalized functions. The polynomial coefficients may be determined apriori and stored along with the tuning software in NVM and accessed as part of normalization data 35.

In some embodiments, optional steps comprising admittance scaling and swing scaling can be applied to unscaled component values 38 at scaling module 40. For example, swing-scaling can be controlled through X-scale vector 41 and admittance scaling can be controlled through Y-scale vector 41. X-scale vector 41 and Y-scale vector 41 are also referred to herein as scaling parameters 41). Scaling parameters 41 may be included in application parameters 16 in some embodiments. X-scale vector 41 can include appropriate state-scaling factors for modulator states, with default state-scaling factor values being one. Increasing the state-scaling factors can trade increased distortion or increased susceptibility to out-of-band signals for reduced noise. Admittance scaling can be controlled with Y-scale vector 41, which can include admittance-scaling factors for any integrators in Δ-Σ ADC 12. Scaling module 40 may scale unscaled component values 38 appropriately to generate (scaled) component values 42.

According to various embodiments, mapping module 44 may map component values 42 to appropriate register settings of Δ-Σ ADC 12 using process parameters 18. The register settings (e.g., register codes) may be also constrained by ranges of allowable values for each specific component. If the desired component value falls outside the allowable range, a maximum or minimum value may be assigned. Alternatively, the component can be brought into the allowable range by adjusting the X-scale and Y-scale vectors 41 associated with the component.

Figure 3:
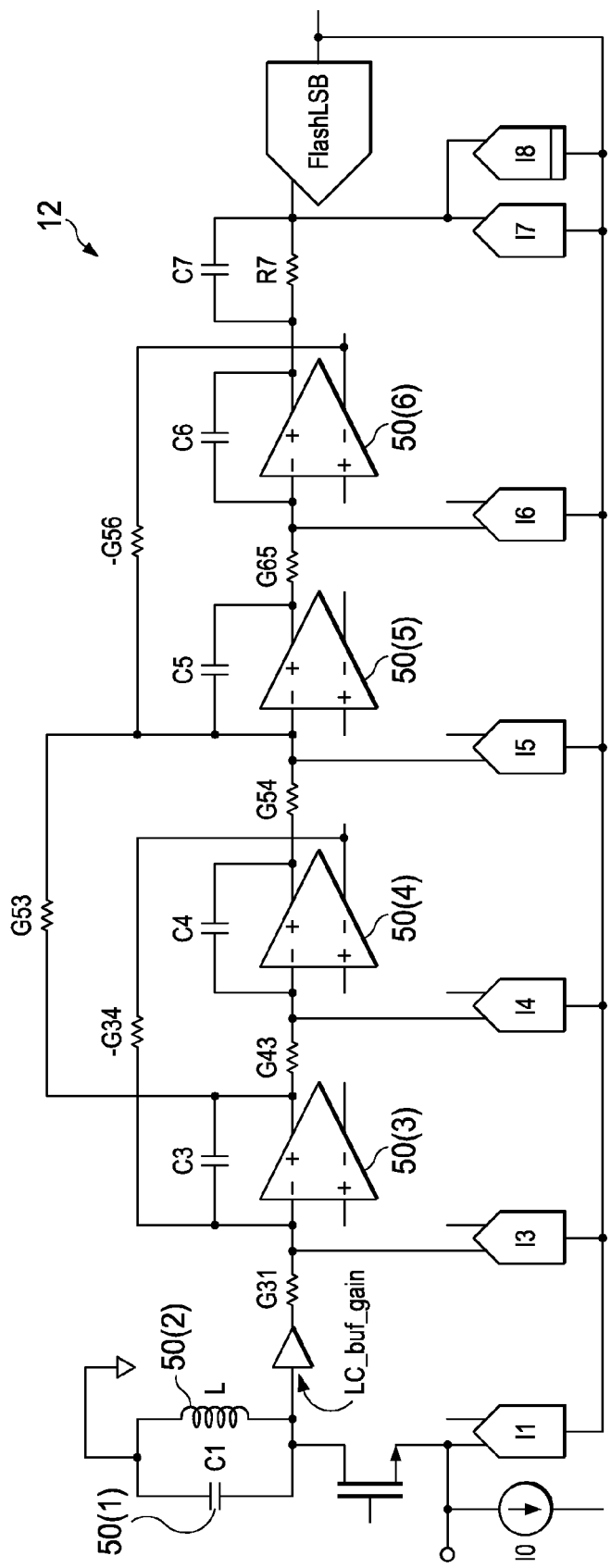
FIG. 3 is a simplified circuit diagram of other example details of an example $\Delta$-$\Sigma$ ADC according to one embodiment.

Turning to FIG. 3, FIG. 3 is a simplified circuit diagram illustrating an example highly programmable Δ-Σ ADC 12. Example highly programmable Δ-Σ ADC 12 includes integrators 50(1)-50(5), feedback DACs, and appropriate passive components, such as resistors and capacitors. In an LC mode, Δ-Σ ADC 12 has 20 control signals 22: 5 control signals for the integrating capacitors ($C_1$, $C_3$, $C_4$, $C_5$, and $C_6$), 6 for the feedback DACs ($I_1$, $I_3$, $I_4$, $I_5$, $I_6$, $I_7$, $I_8$), 7 for the internal conductances ($G_{31}$, $G_{43}$, $G_{34}$, $G_{53}$, $G_{54}$, $G_{65}$, $G_{56}$), 1 for the flash LSB and a LC buffer gain parameter (LC_buf_gain parameter). The coefficient calculation translates 13 application and scaling parameters (e.g., 3 application parameters, including $F_{ck}$ (clock frequency), $F_0$, BW); and 10 nominally-unity scaling parameters 41) into 20 ADC tuning parameters.

In various embodiments, component calculator 30 can approximate the normalized tuning parameters with polynomial functions of the normalized application parameters $\{f_0, bw\}$. The normalized tuning parameters may be converted into ADC settings by a series of simple mathematical operations (e.g., addition, subtraction, multiplication, and division) and one or more conditional statements. For example, in a range of interest for the example Δ-Σ ADC 12 of the FIGURE, most of the ADC coefficients (e.g., ADC coefficient refers to a ratio such as $$\frac{G_{ij}}{F_s C_i}, \frac{I_i}{F_s C_i},$$

etc. that may be associated with filter coefficients, filter performance, LANA performance, etc. of the ADC) may be adequately approximated by an example polynomial of the form:

$$p = a_{00} + a_{10}f_0 + a_{20}f_0^2 + a_{30}f_0^3 + a_{40}f_0^4 + bw(a_{01} + a_{11}f_0 + a_{21}f_0^2)$$

where p represents a normalized ADC coefficient, and $a_{ij}$ represents polynomial coefficients. The example polynomial function is a 4th-order polynomial in $f_0$ with an added term comprising the normalized bandwidth bw multiplied by a 2nd-order polynomial in $f_0$. Each ADC coefficient in example Δ-Σ ADC 12 can be described by its own polynomial function, and a collection of such polynomials (e.g., in the form of the polynomial coefficient values and the polynomial function) may be stored in the NVM and accessed as part of normalization data 35. When an ADC coefficient such as $$\frac{G_{31}}{F_s C_3}$$

ratio is to be computed, normalized formulae module 34 may evaluate the appropriate polynomial at the given bw and $f_0$. To obtain the $G_{31}$ component value, denormalize module 36 may multiply the result of the polynomial evaluation by appropriate component values and other parameters such as $C_3$ and $F_s$.

In various embodiments, denormalized formulae module 32 may use appropriate denormalized formulae to explicitly determine certain ADC component values (e.g., $G_{ij}$, $C_i$, $I_i$) directly. For example, as the inductor value L and center frequency $F_0$ is set in application parameters 16 (e.g., by the user), the value of $C_1$ follows directly from the following equation:

$$C_1 = \frac{1}{(2\pi F_0)^2 L}$$

Similarly, a direct calculation of the form $C = a_1 \times F_s + a_0$ can provide sufficient accuracy for the integrating capacitors when high-order polynomials are used to approximate the ADC coefficients. The values of $a_1$ and $a_0$ may be determined by a linear curve-fit on a portion of normalization data 35 associated with scaled delta-sigma modulator realizations.

In some embodiments, additional steps may be applied to further refine the computed component values. One example step uses knowledge about the resonant frequencies of second and third stage resonators with respect to bw and $f_0$. The resonance frequencies of resonators in the second and third stages are provided according to the following equations, respectively:

$$F_{02} = \frac{1}{2\pi}\left(\sqrt{\frac{G_{34}(-G_{43})}{C_3 C_4}}\right)$$

$$F_{03} = \frac{1}{2\pi}\left(\sqrt{\frac{G_{56}(-G_{65})}{C_5 C_6}}\right)$$

The relationships for resonance frequencies of the second and third stage resonators in the example Δ-Σ ADC 12 can be used to tweak component values. For example, if the resonance frequency is high by 1%, $C_5$ and $C_6$ can be increased by 1% to compensate.

Another step to further fine-tune (e.g., refine, tweak) the computed component values obtained via the polynomial formulae may be aimed at improving the control of the Δ-Σ ADC 12's noise transfer function. For example, when Δ-Σ ADC 12 is configured as a bandpass ADC, the DC gain of the feedback path of the loop filter ($L1_{dc}$) may be controlled suitably. $L1_{dc}$ may be set accurately based on the DC gain of the noise transfer function according to the following equation:

$$NTF_{dc} = \frac{1}{(1 - L1_{dc})}$$

For a typical target value such as $NTF_{dc} = 3 \pm 10\%$, $L1_{dc}$ may be $0.67 \pm 5\%$, and at higher values of $NTF_{dc}$ the $L1_{dc}$ accuracy requirement may be increasingly stringent. For the loop filter shown in the example Δ-Σ ADC 12, $L1_{dc}$ may be derived from a complex expression involving many terms, which partially cancel, resulting in an ill-controlled $L1_{dc}$. Hence, to correct for the ill-controlled $L1_{dc}$, one of the terms in $L1_{dc}$, for example the term controlled by $I_7$, may be adjusted to match $L1_{dc}$ with a target (e.g., desired) value. Specifically, $I_7$ may be computed from the following example equation:

$$I_7 = \frac{L1_{DCTarget} - L1_{DCwithI_7=0}}{R_7}$$

For the highly-programmable example Δ-Σ ADC 12 of the FIGURE, swing-scaling can be controlled through appropriate Xscale vectors 41 including the state-scaling factors for the six modulator states. For example, to accomplish state scaling on integrator 50(3) by X-scale vector 41, the coefficients associated with the input to integrator 50(3), namely those corresponding to $G_{31}$, $G_{34}$ and $I_3$ can be multiplied by X-scale vector 41 and the coefficient(s) associated with the output of integrator 50(3), namely $G_{43}$, would be divided by the same X-scale vector 41.

Similarly, admittance scaling can be controlled through appropriate Y-scale vectors 41 including admittance-scaling factors for the four backend integrators 50(3)-50(6). For example, a first Y-scale vector 41 (e.g., Yscale(1)) may multiply the integrating capacitance $C_3$, the feedback current $I_3$ and the input conductances ($G_{31}$, $G_{34}$) of integrator 50(3). Setting Yscale(1) to a value greater than one can reduce the noise of integrator 50(3) but could increase the output current demand of its amplifier and all the amplifiers, which drive integrator 50(3).

Mapping module 44 may map computed component values 42 to appropriate register settings of highly-programmable example Δ-Σ ADC 12 of the FIGURE. For example, the value of C1 is governed by the following equation:

$$C_1 = C_{10} + C_{1u} \times REG$$

where REG is a register setting corresponding to $C_1$, and $C_{10}$ (e.g., base capacitance) and $C_{1u}$ are included in process parameters 18 and may be process-dependent and determined by suitable calibration procedures.

Figure 4:
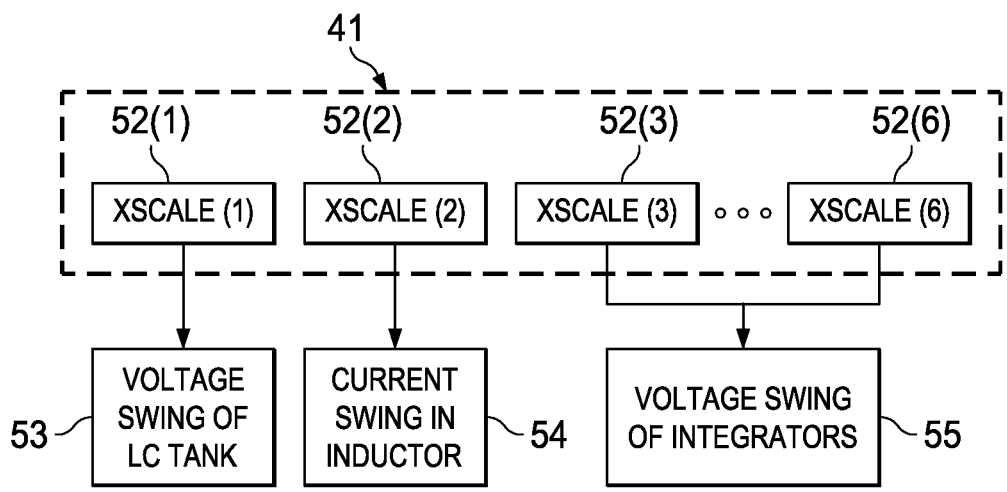
FIG. 4 is a simplified block diagram illustrating other example details of an embodiment of the system.

Turning to FIG. 4, FIG. 4 is a simplified block diagram illustrating example details associated with scaling parameters 41 related to example highly-programmable example Δ-Σ ADC 12 of FIG. 3. Scaling parameters 41 can include X-scale vectors 52(1)-52(6). X-scale vector 52(1) may multiply an allowable voltage swing of the LC tank 53. X-scale vector 52(2) may multiply the current-swing in the inductor 54 and, hence, also multiply the full-scale current appropriately. X-scale vectors 52(3)-52(6) may multiply voltage swing of integrators 55. Increasing X-scale parameters 52(1)-52(6) may trade increased distortion or increased susceptibility to out-of-band signals for reduced noise.

Figure 5:
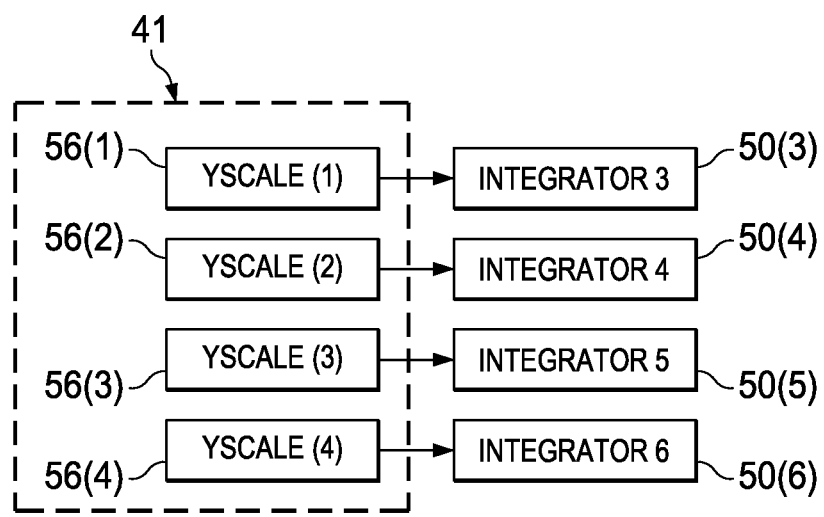
FIG. 5 is a simplified block diagram illustrating example details associated with an embodiment of the system.

Turning to FIG. 5, FIG. 5 is a simplified block diagram showing example details associated with scaling parameters 41 related to example highly-programmable example Δ-Σ ADC 12 of FIG. 3. Scaling parameters 41 can include Y-scale vectors 56(1)-56(4). Y-scale vector 56(1) may include admittance scaling factors for integrator 50(1); Y-scale vector 56(2) may include admittance scaling factors for integrator 50(2); Y-scale vector 56(3) may include admittance scaling factors for integrator 50(3); and Y-scale vector 56(4) may include admittance scaling factors for integrator 50(4).

Figure 6:
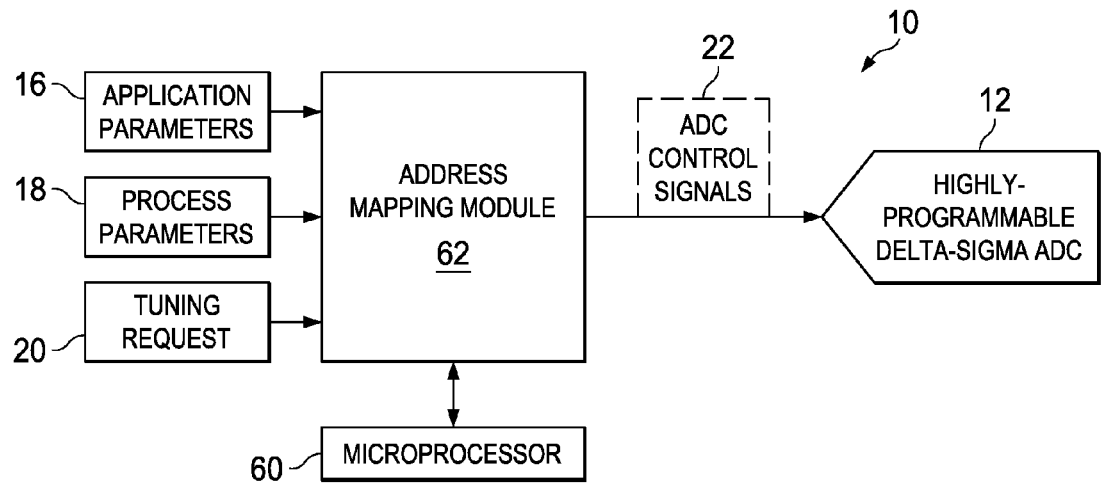
FIG. 6 is a simplified block diagram illustrating other example details associated with an embodiment of the system.

Turning to FIG. 6, FIG. 6 is a simplified block diagram illustrating example details of an embodiment of system 10. System 10 can include a microprocessor 60 (e.g., ARM Cortex M0) and an address mapping module 62 that interfaces with highly-programmable Δ-Σ ADC 12. Address mapping module 62 can be configured to receive application parameters 16, process parameters 18 and tuning request 20. The component calculation of component calculator 30, scaling operations of scaling module 40, and mapping operations of mapping module 44 may be implemented with software using microprocessor 60. Hence, component calculator 30, scaling module 40, and mapping module 44 may be realized appropriately on microprocessor 60.

Address mapping module 62 can handle data interactions and allow microprocessor 60 to treat the data interactions as simple memory reads and writes. In some embodiments, the procedures handled by the software can be implemented using floating point representation. In other embodiments, the software can be programmed using fixed-point representation, for example, to reduce the amount of memory and number of libraries used to execute the software.

Figure 7:
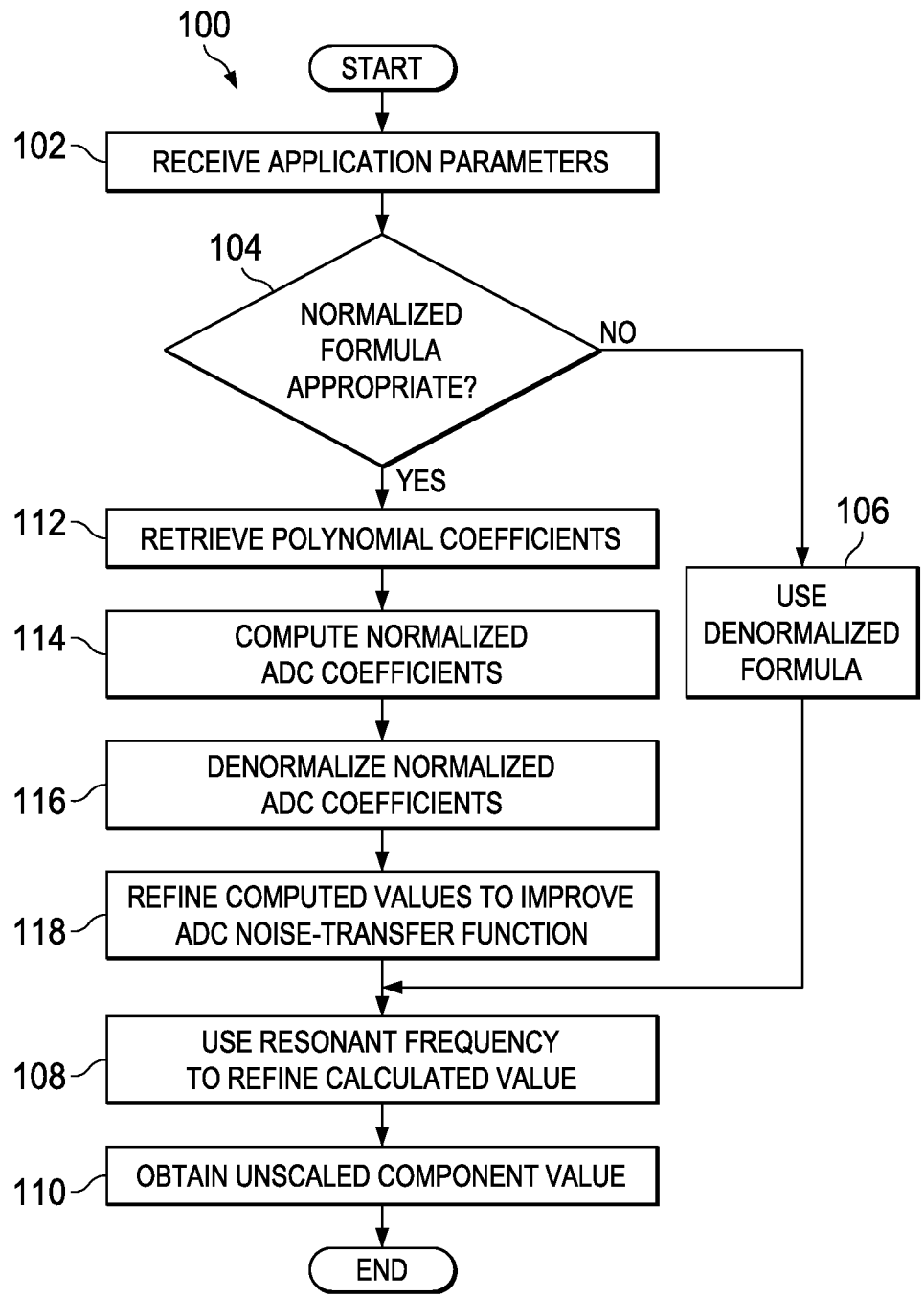
FIG. 7 is a simplified flow diagram illustrating example operations that may be associated with an embodiment of the system.

Turning to FIG. 7, FIG. 7 is a simplified flow diagram illustrating example operations 100 that may be associated with component calculator 30 of digital tuning engine 14 according to embodiments of system 10. At 102, application parameters 16 may be received at digital tuning engine 14. At 104, a determination may be made whether normalized formula is appropriate to calculate a specific component value. If not, at 106, appropriate denormalized formula may be used to compute the relevant unscaled component value. At 108, resonant frequency may be used to refine the calculated component value. At 110, the unscaled component value may be obtained from the denormalized formula and resonant frequency refinements.

Turning back to 104, if the normalized formula is appropriate for the specific component, at 112, polynomial coefficients of the relevant polynomial functions may be retrieved as part of normalization data 35. At 114, normalized ADC coefficients may be computed, for example, by substituting values of suitable application parameters 18 into the polynomial function. At 116, the normalized ADC coefficients may be denormalized to compute the relevant component value. At 118, the computed values may be refined, for example, to improve ADC noise transfer function. The operations may step back to 108, and proceed thereafter.

Figure 8:
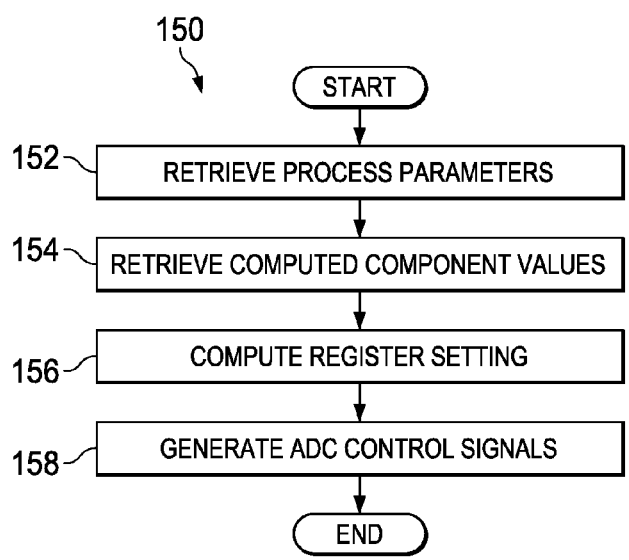
FIG. 8 is a simplified flow diagram illustrating other example operations that may be associated with an embodiment of the system.

Turning to FIG. 8, FIG. 8 is a simplified flow diagram illustrating example operations 150 that may be associated with mapping module 44 of digital tuning engine 14 according to embodiments of system 10. At 152, process parameters 18 may be retrieved. At 154, computed component values 42 may be retrieved. At 156, register settings may be computed from process parameters 18 and computed component values 42. at 158, ADC control signals 22 may be generated.

Figure 9:
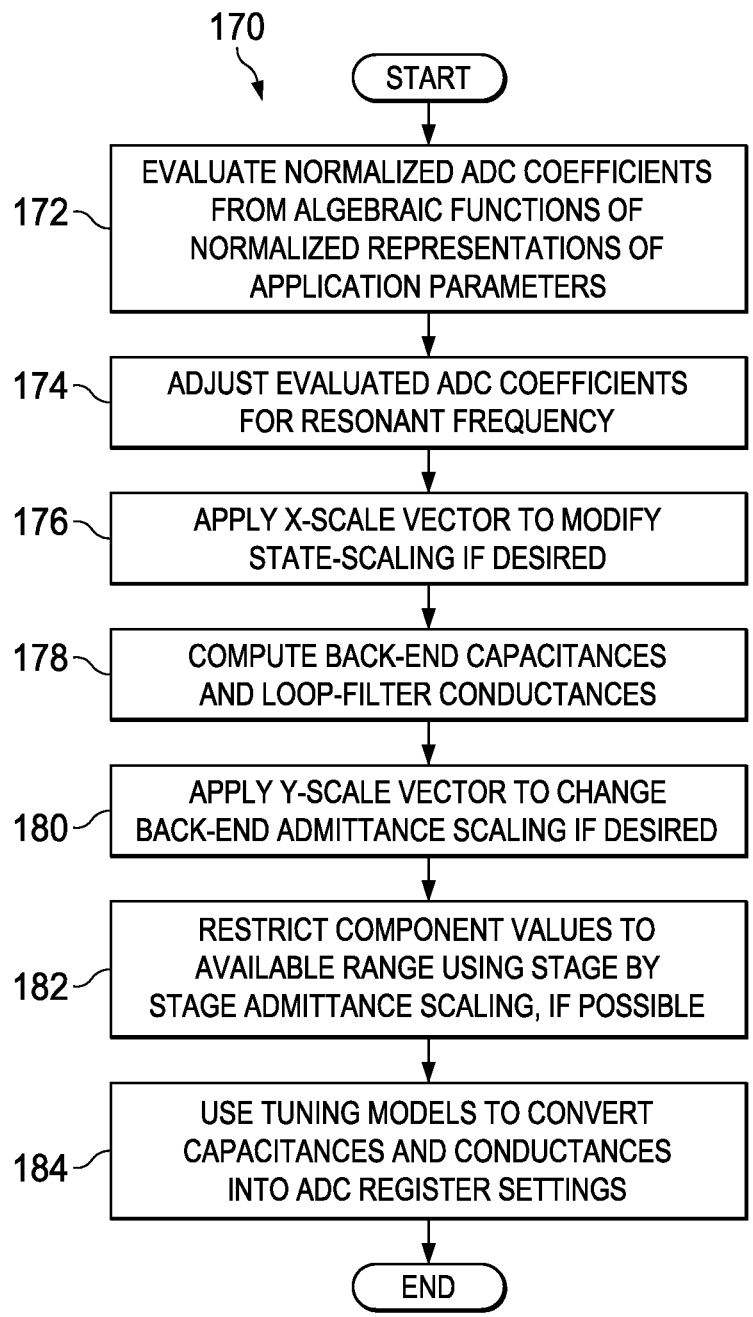
FIG. 9 is a simplified flow diagram illustrating yet other example operations that may be associated with an embodiment of the system.

Turning to FIG. 9, FIG. 9 is a simplified flow diagram illustrating example operations 170 that may be associated with digital tuning engine 14 according to embodiments of system 10. At 172, normalized ADC coefficients may be evaluated from algebraic functions of normalized representations (e.g., $f_0$, bw) of application parameters (e.g., $F_0$, BW, etc.). At 174, the evaluated ADC coefficients may be adjusted for resonant frequency. For example, the ADC coefficients may be adjusted to get a desired (e.g., target) value of the resonant frequencies of the various resonators in Δ-Σ ADC 12.

At 176, appropriate X-scale vectors 41 mat be applied to modify state-scaling, if desired. At 178, back-end capacitances and loop-filter conductances may be computed (e.g., from denormalized formulae). At 180, suitable Y-scale vectors 41 may be applied to change back-end admittance scaling, if desired. At 182, component values to available range using stage-by-stage admittance scaling, if possible. At 184, suitable tuning models may be used to convert capacitances and conductances into ADC register settings. Component values may be limited to an available range and errors can be reported should limiting occur.

In the discussions of the embodiments above, the capacitors, inductors, ADCs, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an integrated circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of ADC control signals, the topology of the ADC, the order of the polynomial formulae, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, power-train systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smart-phones, tablets, security systems, personal computers (PCs), gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An integrated circuit for real time tuning of an analog-to-digital converter (ADC), comprising:
    an input for receiving a tuning request for configuring the ADC based on at least one parameter;
    a component calculator for determining a tuning parameter for the ADC from the at least one parameter; and
    an output for sending a control signal to configure the ADC based on the tuning parameter.

2. The integrated circuit of claim 1, wherein the component calculator calculates at least one component value from the at least one parameter to determine the tuning parameter.

3. The integrated circuit of claim 2, comprising:
    a scaling module for scaling the component value from an unscaled component value to a scaled component value; and
    a mapping module for generating the control signal based on the scaled component value.

4. The integrated circuit of claim 3, wherein the mapping module generates the control signal based on the scaled component value and at least one process parameter.

5. The integrated circuit of claim 4, wherein the mapping module uses suitable tuning models to convert the scaled component value into a corresponding register setting of the ADC based on the process parameter.

6. The integrated circuit of claim 5, wherein the register setting is constrained by a range of allowable values for the component value.

7. The integrated circuit of claim 3, wherein the at least one parameter includes a scaling parameter to scale the unscaled component value.

8. The integrated circuit of claim 1, wherein the tuning parameter is calculated using a polynomial function that approximates the at least one parameter.

9. The integrated circuit of claim 1, wherein the tuning parameter is converted into an ADC setting through a series of mathematical operations.

10. The integrated circuit of claim 1, where the at least one parameter includes an application parameter that relates to operation of the ADC.

11. A method executed by an integrated circuit tuning engine for real-time programming of an ADC, comprising:
receiving a tuning request for configuring the ADC based on at least one parameter;
determining a tuning parameter for the ADC from the at least one parameter; and
sending a control signal to configure the ADC based on the tuning parameter.

12. The method of claim 11, further generating the control signal based on at least one process parameter.

13. The method of claim 11, further comprising calculating at least one component value from the at least one parameter to determine the tuning parameter.

14. The method of claim 13, further comprising scaling the component value from an unscaled component value to a scaled component value, and generating the control signal based on the scaled component value.

15. The method of claim 13, wherein generating the control signal comprises using suitable tuning models to convert the computed component value into a corresponding register setting of the ADC based on the process parameter.

16. The method of claim 15, wherein the register setting is constrained by a range of allowable values for the component value.

17. The method of claim 11, wherein the tuning parameter is calculated using a polynomial function that approximates the at least one parameter.

18. The method of claim 11, wherein the tuning parameter is converted into an ADC setting through a series of mathematical operations.

19. The method of claim 11, where the at least one parameter includes an application parameter that relates to operation of the ADC.

20. An electrical circuit for real-time time tuning of an ADC, comprising:
means for receiving a tuning request for programming the ADC based on at least one parameter;
means for determining a tuning parameter for the ADC from the at least one parameter; and
means for sending a control signal to configure the ADC based on the tuning parameter.

21. The integrated circuit of claim 1, wherein the integrated circuit translates a plurality of parameters to corresponding control signals of the ADC.

22. The integrated circuit of claim 21, wherein the control signals control integrating capacitors, internal conductance, and an LC buffer gain of the ADC.

23. The integrated circuit of claim 1, wherein the ADC includes at least one analog loop filter with programmable components, a quantizer with input coupled to an output of the loop filter and at least one digital to analog converter (DAC) with input coupled to an output of the quantizer and output coupled to the analog loop filter.

24. The integrated circuit of claim 23, wherein the ADC further includes a plurality of digital inputs that control the programmable components.

25. The integrated circuit of claim 1, wherein the at least one parameter includes a scaling parameter for one of state scaling of modulator states of the ADC and admittance scaling of integrators in the ADC.

26. The integrated circuit of claim 1, wherein the at least one parameter includes a process parameter determined from a test performed on the ADC.

27. The integrated circuit of claim 1, wherein the at least one parameter is stored in a memory element and accessed by the integrated circuit.

28. The integrated circuit of claim 1, wherein a portion of the integrated circuit is implemented on a microprocessor electrically connected to the ADC.

29. The integrated circuit of claim 28, wherein the microprocessor executes instructions stored in a memory element, wherein the instructions comprise the component calculator.

30. The integrated circuit of claim 29, wherein the instructions are stored as fixed-point representations in the memory element.

31. The integrated circuit of claim 29, comprising the ADC.

32. The method of claim 11, wherein the tuning parameter is determined from a polynomial function whose coefficients are pre-calculated and stored in a memory element for access by the component calculator.

33. The method of claim 11, wherein the coefficients indicate normalized values of ADC coefficients.

34. The method of claim 11, wherein a noise transfer function is used to tweak the tuning parameter determined from the polynomial function.

35. The method of claim 11, wherein the control signal is unchanged until another tuning request is received.

* * * * *